(12) United States Patent
Abe et al.

(10) Patent No.: US 12,076,834 B2
(45) Date of Patent: Sep. 3, 2024

(54) EDDY CURRENT SENSOR

(71) Applicant: EBARA CORPORATION, Tokyo (JP)

(72) Inventors: Atsushi Abe, Tokyo (JP); Katsuhide Watanabe, Tokyo (JP); Taro Takahashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 375 days.

(21) Appl. No.: 16/915,738

(22) Filed: Jun. 29, 2020

(65) Prior Publication Data
US 2021/0001447 A1 Jan. 7, 2021

(30) Foreign Application Priority Data

Jul. 3, 2019 (JP) ................................ 2019-124522

(51) Int. Cl.
| | | |
|---|---|---|
| *B24B 49/10* | (2006.01) | |
| *B24B 37/005* | (2012.01) | |
| *G01B 7/06* | (2006.01) | |
| *H01L 21/304* | (2006.01) | |
| *H01L 21/66* | (2006.01) | |
| *H01L 21/67* | (2006.01) | |

(52) U.S. Cl.
CPC .......... *B24B 49/105* (2013.01); *B24B 37/005* (2013.01); *G01B 7/105* (2013.01); *H01L 21/304* (2013.01); *H01L 21/67253* (2013.01); *H01L 22/26* (2013.01)

(58) Field of Classification Search
None
See application file for complete search history.

(56) References Cited

U.S. PATENT DOCUMENTS

| | | | | |
|---|---|---|---|---|
| 3,611,120 | A * | 10/1971 | Forster | G01N 27/9006 324/225 |
| 4,015,101 | A * | 3/1977 | Hannappel | B23Q 35/13 318/576 |
| 4,445,089 | A * | 4/1984 | Harrison | G01N 27/9006 324/238 |
| 4,771,238 | A * | 9/1988 | Caruso | G01B 7/06 324/225 |
| 4,804,912 | A | 2/1989 | Lysen | |
| 5,606,260 | A * | 2/1997 | Giordano | G01V 3/28 324/225 |

(Continued)

FOREIGN PATENT DOCUMENTS

| | | |
|---|---|---|
| DE | 102010009923 A1 | 8/2011 |
| JP | S52-010167 A | 1/1977 |

(Continued)

*Primary Examiner* — Sylvia MacArthur
(74) *Attorney, Agent, or Firm* — BakerHostetler (57) ABSTRACT

The eddy current sensor for measuring the film thickness of a conductive film formed on a substrate includes a core made of a magnetic material that has a base portion, and outer legs provided to the base portion at both end portions in a first direction of the base portion respectively, an excitation coil that is arranged on the core and forms an eddy current in the conductive film, and a detection coil that is arranged on the core and detects the eddy current formed in the conductive film. The length of the base portion in the first direction is not less than the length of the base portion in a second direction that is substantially orthogonal to the first direction.

8 Claims, 8 Drawing Sheets

(56) References Cited

U.S. PATENT DOCUMENTS

| | | | |
|---|---|---|---|
| 6,456,069 B1* | 9/2002 | Scarzello | G01R 33/045 |
| | | | 324/202 |
| 7,016,795 B2* | 3/2006 | Swedek | H01L 21/67253 |
| | | | 702/170 |
| 7,112,960 B2 | 9/2006 | Miller et al. | |
| 7,112,961 B2* | 9/2006 | Lei | G01B 7/105 |
| | | | 324/226 |
| 7,999,540 B2* | 8/2011 | Miller | H01L 21/67253 |
| | | | 324/239 |
| 10,933,507 B2* | 3/2021 | Takahashi | B24B 37/013 |
| 2007/0139043 A1 | 6/2007 | Miller et al. | |
| 2010/0124792 A1 | 5/2010 | Iravani et al. | |
| 2011/0189856 A1* | 8/2011 | Xu | B24B 49/105 |
| | | | 438/692 |
| 2012/0276662 A1* | 11/2012 | Iravani | B24B 49/105 |
| | | | 438/10 |
| 2015/0176959 A1 | 6/2015 | Avilov | |
| 2015/0371913 A1* | 12/2015 | Lu | H01L 21/3212 |
| | | | 438/11 |
| 2017/0057051 A1* | 3/2017 | Nakamura | B24B 49/105 |
| 2018/0111251 A1* | 4/2018 | Iravani | B24B 49/105 |
| 2019/0193242 A1* | 6/2019 | Takahashi | B24B 49/16 |
| 2020/0147747 A1* | 5/2020 | Takahashi | B24B 49/105 |
| 2021/0001447 A1* | 1/2021 | Abe | H01L 21/304 |
| 2021/0199415 A1* | 7/2021 | Yamada | B24B 37/107 |
| 2022/0163484 A1* | 5/2022 | Yamada | G01N 27/9006 |

FOREIGN PATENT DOCUMENTS

| | | | | |
|---|---|---|---|---|
| JP | H01-097802 A | | 4/1989 | |
| JP | 10073570 A | * | 3/1998 | |
| JP | H11-337304 A | | 12/1999 | |
| JP | 2007-501509 A | | 1/2007 | |
| JP | 2017-058245 A | | 3/2017 | |
| WO | WO-2012148826 A2 | * | 11/2012 | B24B 49/105 |

* cited by examiner

EDDY CURRENT SENSOR

TECHNICAL FIELD

The present invention relates to an eddy current sensor.

BACKGROUND ART

In recent years, as the degree of integration of semiconductor devices has increased, wirings of circuits have become finer, and the distance between wirings has become smaller, which has made it necessary to flatten the surfaces of substrates (semiconductor wafers, etc.) as polishing target objects. Polishing using a polishing apparatus has been performed as one means of this flattening method.

The polishing apparatus includes a polishing table for holding a polishing pad for polishing a polishing target object, and a top ring (holder) for pressing the polishing target object against the polishing pad while holding the polishing target object. Each of the polishing table and the top ring is rotationally driven by a driver (for example, a motor). Liquid containing abrasive (slurry) is caused to flow over the polishing pad and the polishing target object held by the top ring is pressed against the polishing pad to polish the polishing target object.

With respect to the polishing apparatus, when the polishing target object is insufficiently polished, insulation between circuits may not be established, which may cause a short circuit. Further, when the polishing target object is excessively polished, the cross-sectional area of a wiring is reduced, which causes increase in resistance value or complete removal of the wiring itself, so that there occurs a problem that a circuit itself is not formed. Therefore, it is required in the polishing apparatus to detect an optimum polishing endpoint.

An eddy current sensor is sometimes used to detect the optimum polishing endpoint. The eddy current sensor can measure the film thickness of a conductive film formed on a substrate. The eddy current sensor is disposed inside a polishing table and detects an eddy current which is formed in the conductive film in connection with rotation of the polishing table. Japanese Translation of PCT International Application Publication No. 2007-501509 describes an eddy sensor, and an E type coil is used for the eddy current sensor in this technique.

In recent years, in order to reduce a defective product rate in the neighborhood of edges of semiconductor wafers, it has been required to measure the film thicknesses at portions closer to the edges of semiconductor wafers to control the film thicknesses by in-situ closed loop control. In order to enhance the detection accuracy in edge regions of wafers by the eddy current sensor, it is effective to reduce the outer diameter (caliber) of the eddy current sensor. This is because when the sensor enters the inside of a wafer from the outside of the wafer (or when the sensor exits from the inside of the wafer to the outside thereof), a moving distance of the sensor which is required for the entire sensor to pass over the edge of the wafer and have entered the inside of the wafer (or have exited to the outside of the wafer) is shortened by reducing the outer diameter of the eddy current sensor. In the edge region of the wafer which corresponds to this moving distance, the film thickness cannot be accurately measured because the sensor is not entirely located inside the wafer.

When a coil having a circular cross-section (solenoid type or spiral type coil) is used for the sensor, the moving distance which is required for the entire sensor to have entered the inside of the wafer is substantially equal to the outer diameter of the coil. Therefore, in order to enhance the detection accuracy in the edge region of the wafer by the eddy current sensor, it is effective to reduce the outer diameter of the eddy current sensor.

On the other hand, in order to enhance the measurement accuracy of the film thickness of a conductive film (for example, plating film) of a wafer by the eddy current sensor, it is effective to increase the outer diameter of the eddy current sensor so that a large eddy current is generated in the conductive film to increase the detection output of the eddy current. For these conflicting requirements, a ferrite core having an E-shaped cross-section is adopted in a conventional sensor described in Japanese Translation of PCT International Application Publication No. 2007-501509. The shape of the E-type ferrite core described in Japanese Translation of PCT International Application Publication No. 2007-501509 is an elongated rectangle when the core is viewed from an upper side of the core. One middle leg and two outer legs of the E-shaped ferrite core (these legs correspond to the three horizontally extending lines of the letter of E) extend to be long in parallel to the long sides of the rectangle. The short sides of the rectangle, that is, the width of the rectangle is small.

In a prior art, in the edge region of the wafer, the sensor enters the inside of the wafer from the outside of the wafer or exits from the inside of the wafer to the outside of the wafer such that the long sides of the elongated rectangle are perpendicular to the radial direction of the wafer. Therefore, the length of the sensor in the radial direction of the wafer is equal to the width of the rectangle, and the length of the sensor in the radial direction of the wafer becomes short. As a result, the moving distance of the sensor which is required for the entire sensor to enter the inside of the wafer (or exit to the outside of the wafer) is reduced. Further, the shape of the sensor is an elongated rectangle, and thus assuming that the width is the same, the area of the outer diameter of the sensor increases as the long sides are lengthened to be longer and slenderer, so that the detection output of the eddy current can be increased.

However, with respect to the polishing apparatus, the size of the polishing apparatus is limited, so that the size of the polishing table to which the polishing pad for polishing the substrate is attached is also limited. At this time, as described in Japanese Translation of PCT International Application Publication No. 2007-501509, it may be actually impossible to cause the elongated rectangular core of the sensor to accurately enter the inside of the wafer and exit from the wafer in a direction perpendicular to one diameter direction on the wafer in the edge region of the wafer. For example, as described in Japanese Translation of PCT International Application Publication No. 2007-501509, this is such a case that the sensor is arranged inside the polishing table and the polishing table is rotated.

In this case, the elongated rectangular core enters or exits from the inside of the wafer in a direction which is not perpendicular to one diameter direction on the wafer (that is, obliquely). Therefore, a distance which is required for the core to have entirely entered or exited from the upper side of the wafer is longer than a distance which is required for the core to have entirely entered or exited from the upper side of the wafer in a direction perpendicular to one diameter direction on the wafer. A detection signal of the sensor is inaccurate while the sensor is on a distance until the core has entirely entered or exited from the upper side of the wafer, which causes degradation in the detection accuracy of the film thickness in the edge region of the wafer.

An aspect of the present invention has been made to solve such a problem, and has an object to provide an eddy current sensor that has been improved in the detection accuracy of the film thickness in an edge region of a wafer as compared with a prior art.

CITATION LIST

Patent Literature

PTL 1: Japanese Translation of PCT International Application Publication No. 2007-501509

SUMMARY OF INVENTION

In order to attain the above object, a first aspect of the present invention adopts a configuration of an eddy current sensor for measuring a film thickness of a conductive film formed on a substrate, which comprises: a core made of a magnetic material including a base portion, and outer legs that are provided to the base portion at both end portions in a first direction of the base portion, respectively; an excitation coil that is arranged on the core and fours an eddy current in the conductive film; and a detection coil that is arranged on the core and detects the eddy current formed in the conductive film, wherein a length of the base portion in the first direction is not less than a length of the base portion in a second direction that is substantially orthogonal to the first direction.

A second aspect adopts a configuration of the eddy current sensor described in the first aspect in which the core is an E-shaped core having a middle leg that is provided to the base portion at a center in the first direction of the base portion, the excitation coil is arranged on the middle leg, and the detection coil is arranged on the middle leg. Note that the coil may be provided while the middle leg is omitted. In other words, the excitation coil as an air core coil and the detection coil may be provided at the position of the middle leg.

A third aspect adopts a configuration of the eddy current sensor described in the second aspect in which the core has side legs that are provided to the base portion at both end portions in the second direction of the base portion respectively, the side legs are connected to the outer legs, and the middle leg is surrounded by the side legs and the outer legs.

A fourth aspect adopts a configuration of the eddy current sensor described in the first aspect in which the core is a U-shaped core, the excitation coil is arranged on the outer legs, and the detection coil is arranged on the outer legs.

A fifth aspect adopts a configuration of a polishing apparatus comprising: a polishing table configured so that a polishing pad for polishing the substrate is attached to the polishing table; a driver configured to rotationally drive the polishing table; a holder configured to press the substrate against the polishing pad while holding the substrate; the eddy current sensor according to any one of the first to fourth aspects that is arranged inside the polishing table and configured to detect the eddy current formed in the conductive film as the polishing table rotates; and an endpoint detection controller configured to calculate film thickness data for the substrate from the detected eddy current.

BRIEF DESCRIPTION OF DRAWINGS

FIGS. 3A and 3B are diagrams showing a configuration of the eddy current sensor, wherein

DESCRIPTION OF EMBODIMENTS

Hereinafter, embodiments of the present invention will be described with reference to the drawings. Note that in each of the following embodiments, the same or corresponding members are represented by the same reference signs, and duplicative description thereon may be omitted. Further, the features shown in each embodiment can be applied to the other embodiments as long as they do not contradict each other.

Figure 1:
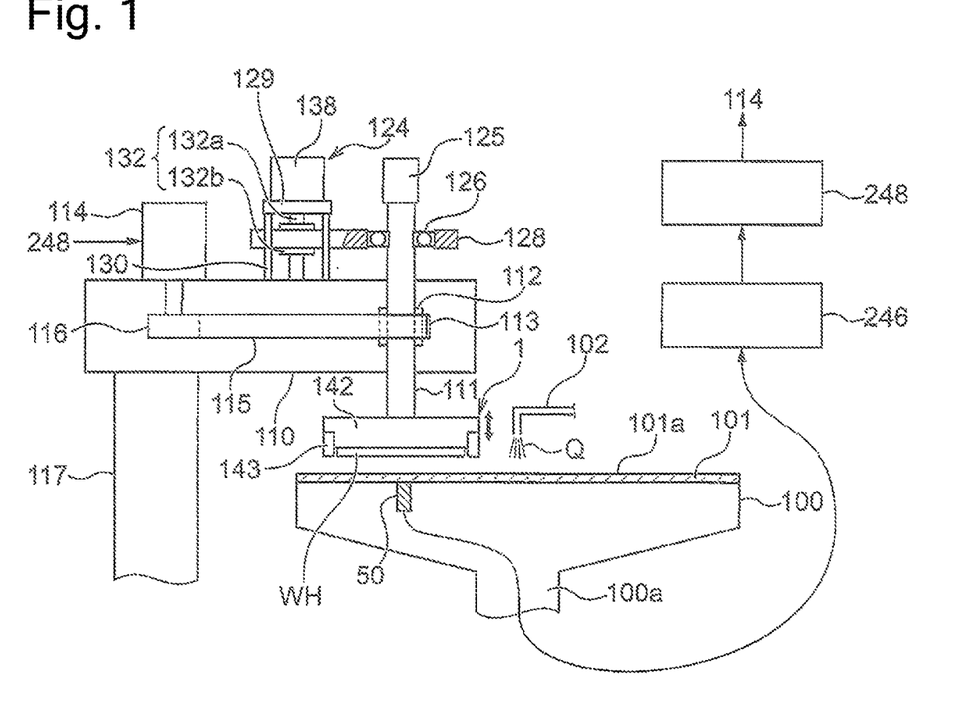
FIG. 1 is a schematic diagram showing an overall configuration of a polishing apparatus according to an embodiment of the present invention.

FIG. 1 is a schematic diagram showing the overall configuration of a polishing apparatus according to the present invention. As shown in FIG. 1, the polishing apparatus includes a polishing table 100, and a top ring (holder) 1 for holding a substrate such as a semiconductor wafer as a polishing target object and pressing the substrate against a polishing surface on the polishing table.

The polishing table 100 is connected via a table shaft 100a to a motor (not shown) as a driver arranged below the polishing table 100, and is rotatable around the table shaft 100a. A polishing pad 101 is attached to the upper surface of the polishing table 100, and a surface 101a of the polishing pad 101 constitutes a polishing surface for polishing a semiconductor wafer WH. A polishing liquid supply nozzle 102 is installed above the polishing table 100, and a polishing liquid Q is supplied onto the polishing pad 101 on the polishing table 100 by the supply nozzle 102. As shown in FIG. 1, an eddy current sensor 50 is embedded inside the polishing table 100.

The top ring 1 is basically configured to include a top ring body 142 for pressing the semiconductor wafer WH against the polishing surface 101a, and a retainer ring 143 for holding an outer peripheral edge of the semiconductor wafer WH so as to prevent the semiconductor wafer WH from protruding out from the top ring.

The top ring 1 is connected to a top ring shaft 111, and the top ring shaft 111 is vertically moved with respect to a top ring head 110 by a vertically moving mechanism 124. By vertically moving the top ring shaft 111, the entire top ring 1 is vertically moved and positioned with respect to the top ring head 110. Note that a rotary joint 125 is secured to an upper end of the top ring shaft 111.

The vertically moving mechanism 124 for vertically moving the top ring shaft 111 and the top ring 1 includes a bridge 128 for rotatably supporting the top ring shaft 111 via a bearing 126, a ball screw 132 secured to the bridge 128, a support stand 129 supported by support poles 130, and an AC servomotor 138 provided on the support stand 129. The support stand 129 for supporting the servomotor 138 is fixed to the top ring head 110 via the support poles 130.

The ball screw 132 includes a screw shaft 132a connected to the servomotor 138 and a nut 132b with which the screw shaft 132a is threadably engaged. The top ring shaft 111 is configured to move vertically integrally with the bridge 128. Therefore, when the servomotor 138 is driven, the bridge 128 moves vertically via the ball screw 132, which causes the top ring shaft 111 and the top ring 1 to move vertically.

The top ring shaft 111 is connected to a rotary cylinder 112 via a key (not shown). The rotary cylinder 112 includes a timing pulley 113 on an outer peripheral portion thereof. A top ring motor 114 is fixed to the top ring head 110, and the timing pulley 113 is connected to a timing pulley 116 provided to the top ring motor 114 via a timing belt 115. Therefore, by rotationally driving the top ring motor 114, the rotary cylinder 112 and the top ring shaft 111 are rotated integrally with each other via the timing pulley 116, the timing belt 115 and the timing pulley 113, so that the top ring 1 rotates. Note that the top ring head 110 is supported by a top ring head shaft 117 which is rotatably supported by a frame (not shown).

In the polishing apparatus configured as shown in FIG. 1, the top ring 1 is capable of holding a substrate such as a semiconductor wafer WH on the lower surface thereof. The top ring head 110 is configured to be swingable around the top ring head shaft 117, and the top ring 1 holding the semiconductor wafer WH on the lower surface thereof is moved from a reception position for the semiconductor wafer WH to an upper side of the polishing table 100 by swinging of the top ring head 110. Then, the top ring 1 is moved downward to press the semiconductor wafer WH against the surface (polishing surface) 101a of the polishing pad 101. At this time, the top ring 1 and the polishing table 100 are respectively rotated, and the polishing liquid is supplied onto the polishing pad 101 from the supply nozzle 102 provided above the polishing table 100. In this way, the semiconductor wafer WH is brought into sliding contact with the polishing surface 101a of the polishing pad 101 to polish the surface of the semiconductor wafer WH.

Figure 2:
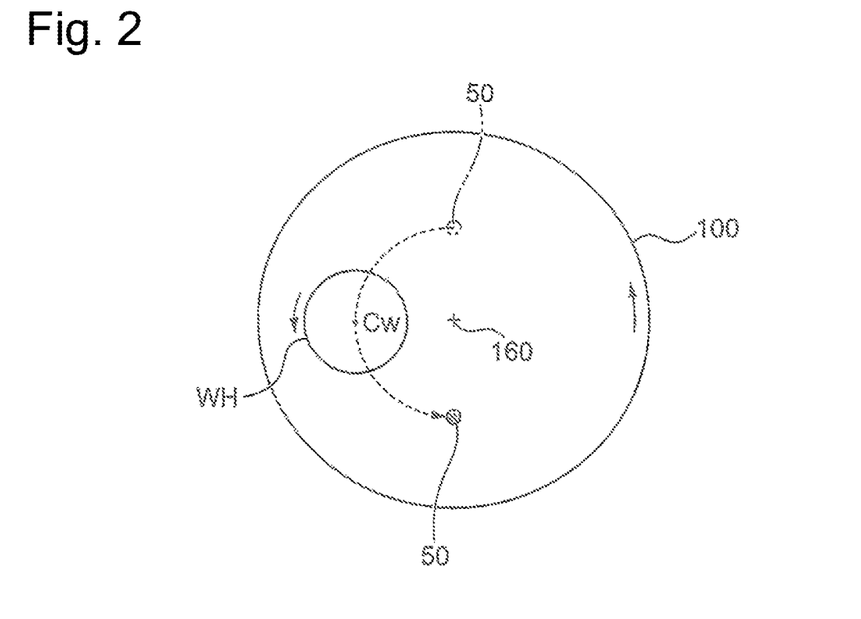
FIG. 2 is a plan view showing a relationship of a polishing table, an eddy current sensor, and a semiconductor wafer.

FIG. 2 is a plan view showing the relationship of the polishing table 100, the eddy current sensor 50, and the semiconductor wafer WH. As shown in FIG. 2, the eddy current sensor 50 is arranged at a position where it passes through the center Cw of the semiconductor wafer WH under polishing which is held by the top ring 1. The polishing table 100 rotates around a rotation center 160. For example, the eddy current sensor 50 is capable of continuously detecting a metal film (conductive film) such as a Cu layer of the semiconductor wafer WH on a transit locus (scan line) while passing below the semiconductor wafer WE.

Next, the eddy current sensor 50 included in the polishing apparatus according to the present invention will be described in more detail with reference to the accompanying drawings.

Figure 3A:
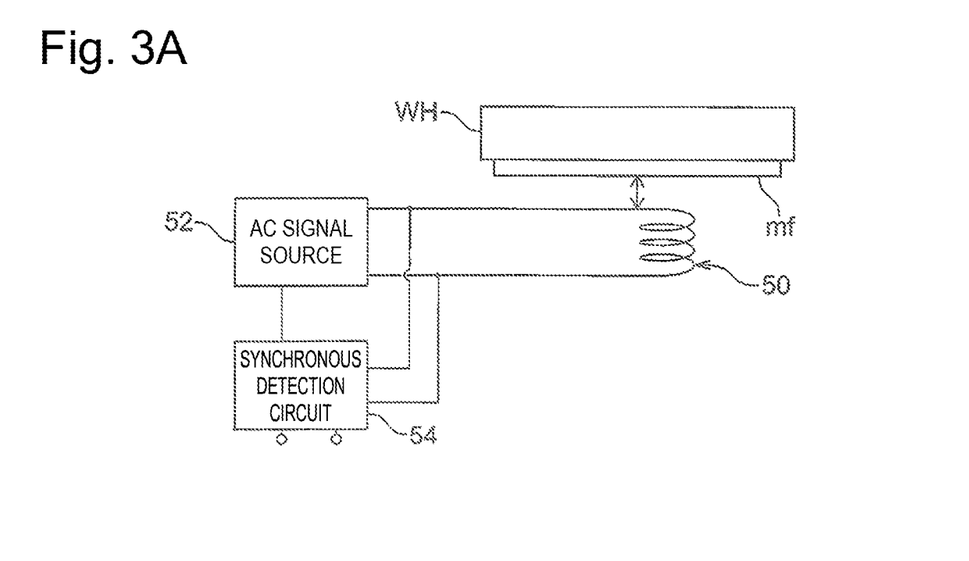
FIG. 3A is a block diagram showing the configuration of the eddy current sensor.
Figure 3B:
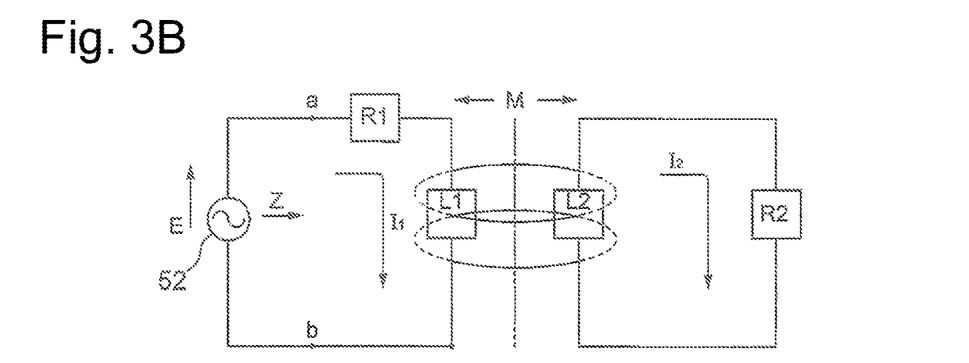
FIG. 3B is a diagram showing an equivalent circuit of the eddy current sensor.

FIGS. 3A and 3B are diagrams showing a configuration of the eddy current sensor 50, wherein FIG. 3A is a block diagram showing the configuration of the eddy current sensor 50, and FIG. 3B is an equivalent circuit diagram of the eddy current sensor 50.

As shown in FIG. 3A, the eddy current sensor 50 is arranged in the vicinity of a metal film (or conductive film) mf as a detection target, and an AC signal source 52 is connected to a coil of the eddy current sensor 50. Here, the metal film (or conductive film) mf as a detection target is, for example, a thin film of Cu, Al, Au, W or the like formed on the semiconductor wafer WH. The eddy current sensor 50 is arranged in the vicinity of, for example, at a distance of about 1.0 to 4.0 mm from, the metal film (or conductive film) as the detection target.

Examples of the eddy current sensor include a frequency type in which an oscillation frequency changes due to generation of an eddy current in the metal film (or conductive film) mf and the metal film (or conductive film) is detected from this frequency change, and an impedance type in which an impedance changes due to generation of an eddy current in the metal film (or a conductive film) mf and the metal film (or conductive film) is detected from this impedance change. In other words, according to the frequency type, when an eddy current $I_2$ changes in an equivalent circuit shown in FIG. 3B, an impedance Z changes, and an oscillation frequency of a signal source (variable frequency oscillator) 52 changes. The change of the oscillation frequency is detected by the detection circuit 54, whereby the change in the metal film (or the conductive film) can be detected. Further, according to the impedance type, when the eddy current $I_2$ changes in the equivalent circuit shown in FIG. 3B, the impedance Z changes. When the impedance Z seen from a signal source (fixed frequency oscillator) 52 changes, the change of the impedance Z is detected by the detection circuit 54, whereby the change of the metal film (or the conductive film) can be detected.

In the impedance type eddy current sensor, signal outputs X, Y, a phase, and a composite impedance Z are taken out as described later. Measurement information of the metal film (or conductive film) Cu, Al, Au, W can be obtained from the frequency F, the impedances X and Y or the like. The eddy current sensor 50 can be incorporated in the polishing table 100 to be arranged in the polishing table 100 at a position in the vicinity of the surface of the polishing table 100 as shown in FIG. 1. The eddy current sensor 50 is positioned so as to face the semiconductor wafer as a polishing target through the polishing pad, and can detect a change of the metal film (or conductive film) from an eddy current flowing in the metal film (or conductive film) on the semiconductor wafer.

With respect to the frequency of the eddy current sensor, a single radio wave, a mixed radio wave, an AM-modulated radio wave, an FM-modulated radio wave, a swept output of a function generator, or a plurality of oscillation frequency sources may be used, and it is preferable to select an oscillation frequency and a modulation method which are excellent in sensitivity in conformity with the film type of the metal film.

The impedance type eddy current sensor will be specifically described below. The AC signal source 52 is an oscillator having a fixed frequency of about 2 to 30 MHz, and for example, a crystal oscillator is used. An AC voltage supplied from the AC signal source 52 causes a current $I_1$ to flow in the eddy current sensor 50. When a current flows through the eddy current sensor 50 arranged in the vicinity of the metal film (or the conductive film) mf, a magnetic flux generated by the current interlinks with the metal film (or the conductive film) mf to form a mutual inductance M therebetween, so that an eddy current $I_2$ flows in the metal film (or conductive film) mf. Here, R1 represents an equivalent resistor on a primary side including the eddy current sensor, and $L_1$ likewise represents a self-inductance on the primary side including the eddy current sensor. On the metal film (or conductive film) mf side, R2 represents an equivalent resistor corresponding to an eddy current loss, and L2 represents a self-inductance thereof. An impedance Z as viewed from the terminals a and b of the AC signal source 52 to the eddy current sensor side changes depending on the magnitude of the eddy current loss formed in the metal film (or conductive film) mf.

Figure 4A:
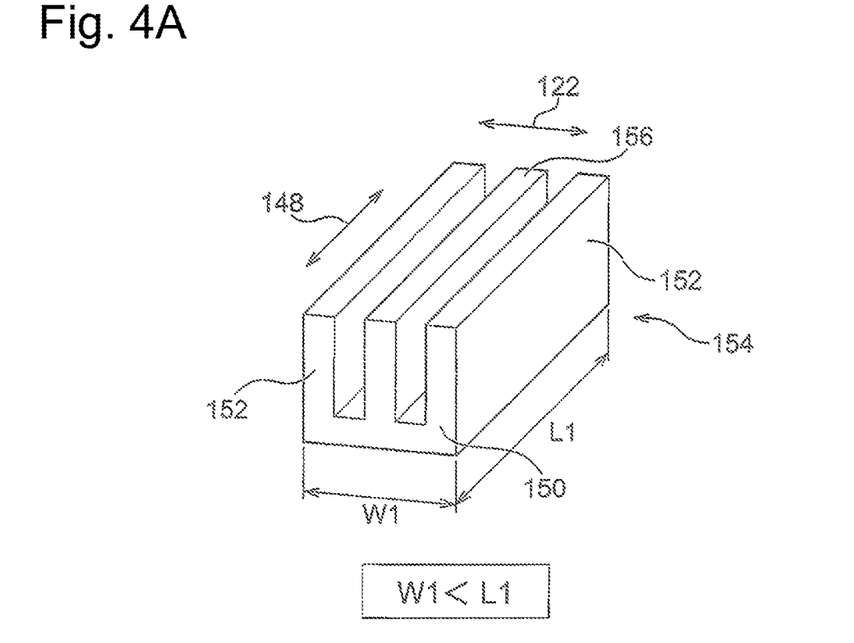
FIG. 4A is a schematic diagram showing a configuration example of a core of a conventional eddy current sensor.
Figure 4B:
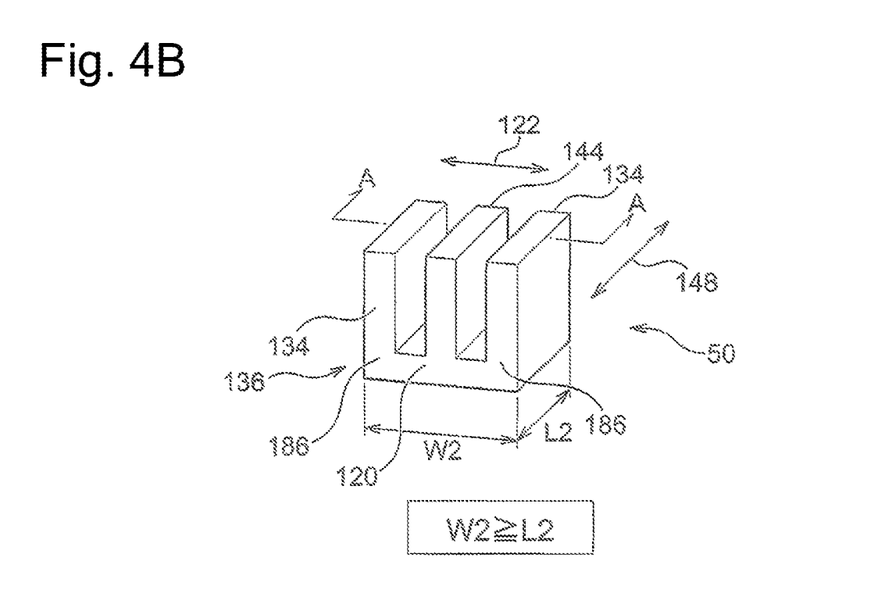
FIG. 4B is a schematic diagram showing a configuration example of a core of an eddy current sensor according to an embodiment of the present invention.

FIGS. 4A and 4B are diagrams showing the core of the conventional eddy current sensor and the core of the eddy current sensor of the present embodiment in comparison with each other. FIG. 4A is a schematic diagram showing the configuration of the core of the conventional eddy current sensor, and FIG. 4B is a schematic diagram showing the configuration of the core 136 of the eddy current sensor 50 of the present embodiment. The eddy current sensor 50 includes a core 136 which is formed of a magnetic material and has a base portion 120 and two outer legs 134 provided to the base portion 120 at both end portions in a first direction 122 of the base portion 120, respectively. The two outer legs 134 face each other.

The length W2 of the base portion 120 in the first direction is equal to or more than the length L2 of the base portion 120 in a second direction 148 that is substantially orthogonal to the first direction. In other words, the first direction 122 is a longitudinal direction of the base portion 120 in this embodiment. In a core 154 of the conventional eddy current sensor shown in FIG. 4A, the length W1 of the base portion 150 in the first direction 122 is shorter than the length L1 of the base portion 150 in the second direction 148 which is substantially orthogonal to the first direction 122. In other words, the first direction 122 is a width direction of the base portion 150 in the prior art.

In the present embodiment, the eddy current sensor includes a core made of a magnetic material that has the outer legs provided to the base portion at both the end portions in the first direction of the base portion respectively, and the length of the base portion in the first direction is not less than the length of the base portion in the second direction substantially orthogonal to the first direction. In other words, when the shape of the base portion is, for example, a rectangle, in the present embodiment, the outer legs are provided to the base portion at both the end portions in the first direction of the base portion (that is, on the short sides of the rectangle), respectively. In a prior art, the outer legs were provided to the long sides of the base portion, respectively. As the distance between the outer legs is shorter, the magnetic field can be intensified. In order to intensify the magnetic field, the distance between the outer legs, that is, the length of the long sides is made as short as possible in the present embodiment. In the prior art, in order to intensify the magnetic field, the distance between the outer legs, that is, the length of the short sides is made as short as possible.

In the present embodiment, unlike the prior art, it is preferable that the length of the long sides is shorter. The length of the long sides can be made shorter than that of the prior art. Therefore, when an elongated rectangular core enters or exits from the wafer in a direction that is not perpendicular to one diameter direction on the wafer (i.e., obliquely), a moving distance of the core until the entire core has entered an upper side of the wafer or exited from the upper side is shorter than that of the prior art. The reason why the length is shorter than that of the prior art will be described later. As a result, a range in which the detection signal of the sensor is inaccurate and the detection accuracy of the film thickness in the edge region of the wafer is deteriorated is narrower than that in the prior art. Therefore, there can be provided an eddy current sensor in which the detection accuracy of the film thickness in the edge region of the wafer is enhanced as compared with the prior art.

With respect to the shape of the core of the present embodiment, when the core is viewed from the upper side thereof, in the edge region of the wafer, the length in the radial direction of the wafer can be made equal to or shorter than the length in a direction perpendicular to the radial direction of the wafer. By shortening the distance which is required for the entire core to have entered the upper side of the wafer, the rise of the detection signal of the sensor is made quick, and deterioration of the detection accuracy in the edge region of the wafer is reduced as compared with the prior art.

Figure 5A:
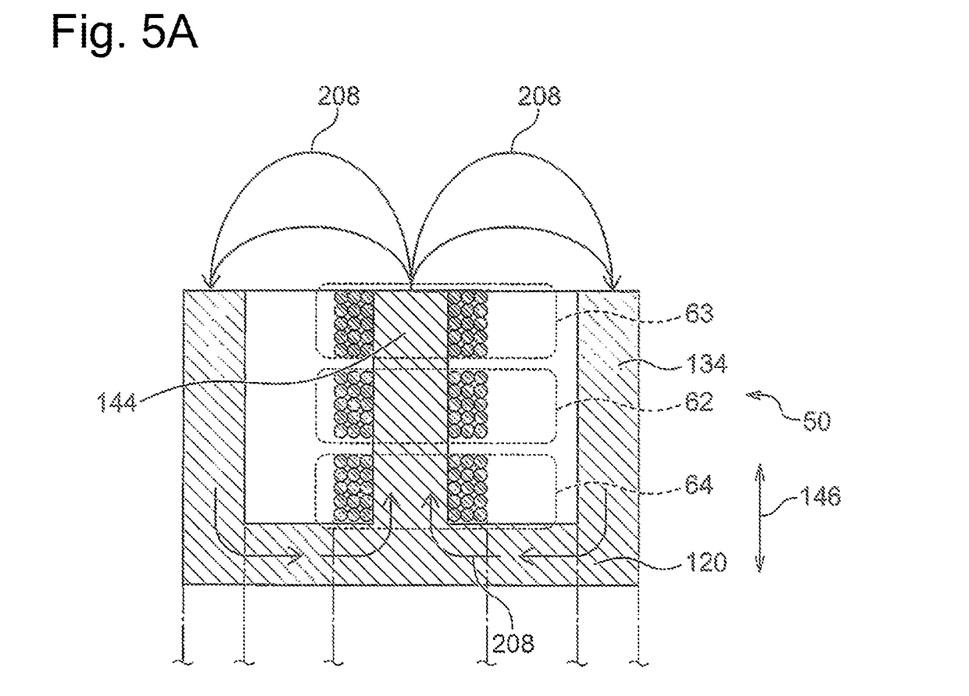
FIGS. 5A and 5B are diagrams showing a detailed shape of the eddy current sensor according to the embodiment of the present invention.
Figure 5B:
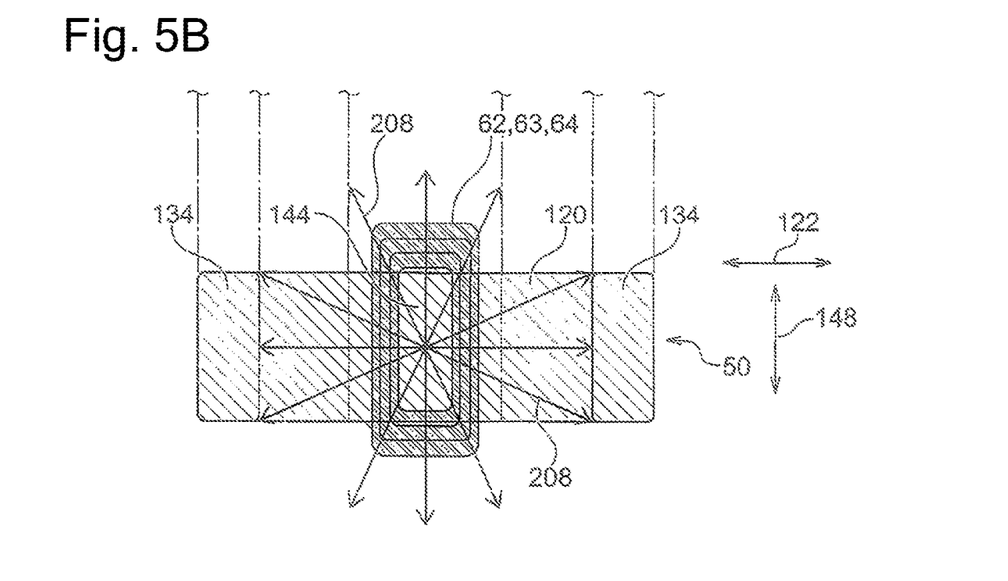

FIGS. 5A and 5B are diagrams showing a detailed shape of the eddy current sensor 50 of the present embodiment. FIG. 5A is a cross-sectional view taken along a line A-A of the eddy current sensor 50 shown in FIG. 4B, and FIG. 5B is a plan view of the eddy current sensor 50. The eddy current sensor 50 includes an excitation coil 62 which is arranged on the core 136 and forms an eddy current in a conductive film on a wafer WH, and a detection coil 63 which is arranged on the core 136 and detects the eddy current formed in the conductive film. The core 136 is an E-shaped core having a middle leg 144 which is provided to the base portion 120 at the center in the first direction 122 of the base portion 120. The excitation coil 62 and the detection coil 63 are arranged on the middle lea 144.

The shapes of the outer legs 134 and the middle leg 144 are rectangles in a plan view, but they are not limited to rectangles, and may be a square, an ellipse, a polygon, a circle, or the like. The shape of the base portion 120 is also a rectangle in a plan view, but is not limited to a rectangle. It may be a square, an ellipse, a polygon, a circle, or the like.

The core 154 of the conventional eddy current sensor shown in FIG. 4A includes a base portion 150 and outer legs 152 which are provided to the base portion 150 at both ends in the first direction 122 of the base portion 150, respectively. In the following description, a width direction means a direction in which the length of the base portion is shorter as compared with a longitudinal direction when the shape of the base portion is a rectangle, a trapezoid, a parallelogram, a quadrangle, an ellipse or the like. When the shape of the base portion is substantially rectangular, the longitudinal direction and the width direction are orthogonal to each other. There is a difference that the first direction 122 is the longitudinal direction in the present embodiment, but the first direction 122 is the width direction in the prior art.

The core 154 is made of a magnetic material. The core 154 is an E-shaped core having a middle leg 156 which is provided to the base portion 150 at the center in the first direction 122 of the base portion 150. The excitation coil 62 and the detection coil 63 are arranged on the middle leg 156.

In the core 154 of the conventional eddy current sensor shown in FIG. 4A, the length W1 in the first direction 122 is shorter than the length L1 in the second direction 148. In the core 136 of the eddy current sensor 50 of the present embodiment shown in FIG. 4B, the length W2 in the first direction 122 is not less than the length L2 in the second direction 148. The difference between the prior art and the present embodiment resides in that the outer legs 152 and the middle leg 156 are arranged side by side in the width direction in the core 154 of the conventional technology, whereas the outer legs 134 and the middle leg 144 are arranged side by side in the longitudinal direction in the core 136 of the present embodiment. A difference in effect between the prior art and the present embodiment which is caused by the above difference will be described later.

As shown in FIGS. 5A and 5B, the eddy current sensor 50 of the present embodiment includes the excitation coil 62 for forming an eddy current in the metal film (or conductive film), the detection coil 63 for detecting the eddy current in the metal film, and a dummy coil 64 for detecting a magnetic field 208 generated from the excitation coil 62. The three coils 62, 63, and 64 are wound around the core 136. Here, the coil 62 located at the center of the three coils 62, 63, and 64 is an excitation coil connected to the AC signal source 52. The excitation coil 62 is supplied with an AC voltage from the AC signal source 52 to form a magnetic field, and this magnetic field forms an eddy current in the metal film mf on the semiconductor wafer WH arranged in the vicinity of the eddy current sensor 50. The detection coil 63 is arranged on the metal film side of the core 136, and detects a magnetic field generated by the eddy current formed in the metal film. The dummy coil 64 is arranged on an opposite side to the detection coil 63 with respect to the excitation coil 62 which is interposed between the dummy coil 64 and the detection coil 63. The dummy coil 64 is connected to a synchronous detection circuit 54 so as to have a phase opposite to that of the detection coil 63, and used so as to make the output of the synchronous detection circuit 54 zero when only the magnetic field 208 generated by the excitation coil 62 is detected by the detection coil 63 and the dummy coil 64 in a state where no metal film (or no conductive film) exists. Therefore, the dummy coil 64 is also called a balance coil.

The eddy current sensor 50 includes the detection coil 63 which is arranged on the middle leg 144 and detects an eddy current formed in the conductive film. A vertical direction 146 of the middle leg 144 is orthogonal to the conductive film on the semiconductor wafer WH. The detection coil 63, the excitation coil 62, and the dummy coil 64 are arranged at different positions in the vertical direction 146 of the middle leg 144. In the vertical direction 146 of the middle leg 144, the detection coil 63, the excitation coil 62, and the dummy coil 64 are arranged in this order from a position closer to the conductive film on the semiconductor wafer WH to a position farther from the conductive film on the semiconductor wafer WH. Lead wires (not shown) for connection to the outside are respectively drawn from the detection coil 63, the excitation coil 62, and the dummy coil 64.

Note that the dummy coil 64 may be omitted. Further, the detection coil 63, the excitation coil 62, and the dummy coil 64 may be arranged at the same position in the vertical direction 146 of the middle leg 144. Still further, the detection coil 63 and the excitation coil 62 may be the same coil. In other words, it is possible for one coil to have the functions of the detection coil 63 and the excitation coil 62.

FIGS. 5A and 5B also show the state of a magnetic flux 208 generated by the eddy current sensor. Since the outer leg 134 is made of the magnetic material, the magnetic flux 208 directing from the middle leg 144 in the first direction 122 is converged into the outer legs 134. Therefore, the spread of the magnetic flux 208 is limited to the first direction 122, so that in the first direction 122, the spread of the magnetic flux 208 is reduced and the magnetic field intensifies. In the second direction 148 perpendicular to the first direction 122, no magnetic material exists on the circumference of the core 136, so that the magnetic flux 208 directing from the middle leg 144 in the second direction 148 is not converged. Therefore, the magnetic flux 208 spreads more greatly in the second direction 148 than that in the first direction 122, and the magnetic field is weaker in the second direction 148 than that in the first direction 122.

In the case of the conventional core 154 shown in FIG. 4A, the outer legs 152 are also made of a magnetic material, so that the magnetic flux 208 directing from the middle leg 156 in the first direction 122 is converged into the outer legs 152. Therefore, the spread of the magnetic flux 208 is limited to the first direction 122, and the magnetic field intensifies in the first direction 122. In the second direction 148 perpendicular to the first direction 122, no magnetic material exists on the circumference of the core 154, so that the magnetic flux 208 directing from the middle leg 156 in the second direction 148 is not converged. Therefore, the magnetic flux 208 spreads more greatly in the second direction 148 than that in the first direction 122, and the magnetic field is weaker in the second direction 148 than that in the first direction 122. Therefore, the prior art has the following problem.

The problem in the prior art will be described with reference to FIG. 6. FIG. 6 shows the positional relationship between the core 154 and the semiconductor wafer WH when the sensor of the prior art (only the core 154 is shown for clarity of description) enters and exits from an edge region 158 of the semiconductor wafer WH. Since the core 154 is arranged inside the polishing table 100, the core 154 rotates around the rotation center 160 of the polishing table 100.

A direction in which the core 154 is arranged inside the polishing table 100 is set so that a direction in which the magnetic field of the core 154 intensifies (that is, a direction in which the spread of the magnetic flux is little) is coincident with the rotation direction of the core 154. The reason why the core 154 is arranged so that the direction in which the magnetic field of the core 154 intensifies is coincident with the rotation direction of the core 154 is to accelerate the rise of the sensor output in the edge region 158 of the wafer WH. Here, the edge region 158 means a period of time (or a moving distance by which the sensor has moved for the period of time) from a time when the sensor starts to substantially enter the place just under the semiconductor wafer WH ("a state where the sensor output substantially starts to detect the metal film of the semiconductor wafer WH") till a time when the entire sensor has substantially enter the place just under the semiconductor wafer WH ("a state where the sensor output has become substantially maximum").

Furthermore, the edge region 158 means a period of time (or a moving distance by the sensor has moved for the period of time) from a time when the entire sensor has been substantially just under the semiconductor wafer WH ("a state where the sensor output has been substantially maximum") till a time when the sensor has substantially completely exited from the semiconductor wafer WH ("a state where the sensor output does not substantially detect the metal film of the semiconductor wafer WH").

The fact that the sensor output rises quickly in the edge region 158 means that a transit time from "the state where the sensor output starts to detect the metal film of the semiconductor wafer WH" till "the state where the sensor output has become maximum" is short. This may be rephrased by "a distance by which the sensor has moved from "the state where the sensor output starts to detect the metal film of the semiconductor wafer WH" till "the state where the sensor output has become maximum" is short". As the sensor output rises more quickly, a range in which the detection signal of the sensor is insufficient (that is, a state where the sensor output has not been maximum) and the detection accuracy of the film thickness in the edge region 158 of the wafer is low is narrower.

In the case of the conventional core 154, the direction in which the magnetic field of the core 154 intensifies is the first direction 122 shown in FIG. 4A as described above. Therefore, in FIG. 6, the first direction 122 and the rotation direction 162 of the core 154 substantially coincide with each other. In this case, as shown in FIG. 6, when the core 154 enters and exits from the edge regions 158, the shape of the sensor is short in radial directions 170 and 178 (the first direction 122) of the semiconductor wafer WH in the edge regions 158 of the wafer WH, and is long in a direction (the second direction 148) orthogonal to a radial direction 164.

Furthermore, it is necessary to install the core 154 in the polishing table 100 so that an incident angle and an exit angle of the core 154 to and from the wafer WH are equal to each other. Here, the incident angle and the exit angle are as follows. The second direction 148 of the core 154 when the core 154 enters the semiconductor wafer WH is referred to as a direction 166. At that time, the core 154 and the semiconductor wafer WH first enter the edge region 158 at an entry point 168. A radial direction of the semiconductor wafer WH at the entry point 168 is referred to as a direction 170. The intersection angle between the directions 166 and 170 is referred to as an incident angle 172.

Note that terms such as the entry point 168 and an exit point 176 are used in this specification, but these terms do not mean that the core 154 actually enters and exits from the edge region 158 of the semiconductor wafer WH. Actually, the core 154 passes through the lower side of the semiconductor wafer WH. "Enter" means that a part of the core 154 first reaches the lower side of the edge of the semiconductor wafer WH, and "exit" means that a part of the core 154 finally leaves the lower side of the edge of the semiconductor wafer WH. Since these states are illustrated as the semiconductor wafer WH and the core 154 are flush with each other in a plan view such as FIG. 6, the terms of "enter and exit from" are used for ease of understanding.

The second direction 148 of the core 154 when the core 154 exits from the semiconductor wafer WH is referred to as a direction 174. At that time, the core 154 and the semiconductor wafer WH finally exit from the edge region 158 at the exit point 176. A radial direction of the semiconductor wafer WH at the exit point 176 is referred to as a direction 178. The intersection angle between the direction 174 and the direction 178 is referred to as an exit angle 180. In the case of FIG. 6, the incident angle 172 and the exit angle 180 are 90 degrees.

The reason why the incident angle 172 and the exit angle 180 are set to be equal to each other is as follows. When the incident angle 172 and the exit angle 180 are different from each other, that is, when the incident angle 172 is not 90 degrees, a transit time at the time of the incidence which is taken from "the state where the sensor starts to detect the metal film of the semiconductor wafer WH" till "the state where the sensor output has become maximum" is different from a transit time at the time of the exit which is taken from "the state where the sensor output has been maximum" till "the state where the sensor no longer detects the metal film of the semiconductor wafer WH". In other words, the range in which the detection accuracy of the film thickness is deteriorated is different between when the core 154 enters the semiconductor wafer WH and when the core 154 exits from the semiconductor wafer WH, and polishing control based on the measured film thickness is complicated. For example, a method of discriminating invalid data (data measured in the edge region 158) and valid data (data measured just under the semiconductor wafer WH and in a region other than the edge region 158) is complicated.

When the core 154 is installed in the polishing table 100 so that the incident angle 172 and the exit angle 180 of the core 154 to and from the wafer WH are set to be equal to each other, the following problem occurs. As can be seen from FIG. 6, the second direction 148 of the core 154 when a center point 182 of the core 154 contacts (starts to enter) the wafer WH and the direction of the diameter 190 of the semiconductor wafer WH are not perpendicular to each other. The second direction 148 of the core 154 when the center point 182 of the core 154 exits from the wafer WH and the direction of the diameter 190 of the semiconductor wafer WH are also not perpendicular to each other.

In order to minimize the distance in the edge region 158, it is necessary that the core 154 moves on the diameter 190 so that the center point 182 of the core 154 moves on the diameter 190 and the second direction 148 is always orthogonal to the diameter 190 during a period of time when the core 154 enters and exits from the semiconductor wafer WH. In comparison with the above best case, in FIG. 6, a distance which is required for the entire core 154 to have entered the inside of the wafer WH and a distance which is required for the entire core 154 to have exited from the wafer WH are longer. As a result, there occurs a problem that the rise and fall of the sensor output in the edge regions 158 are slow.

Note that the setting of "the core 154 moves on the diameter 190 so that the center point 182 of the core 154 moves on the diameter 190 and the second direction 148 is always orthogonal to the diameter 190 during a period of time when the core 154 enters and exits from the semiconductor wafer WH" is theoretically impossible because the radius of the polishing table 100 is finite. As the radius of the polishing table 100 is larger, the core 154 can enter and exit more perpendicularly with respect to the diameter 190 of the wafer WH, but the radius of the polishing table 100 can only be increased up to a limited value.

Figures 6A, 6B:
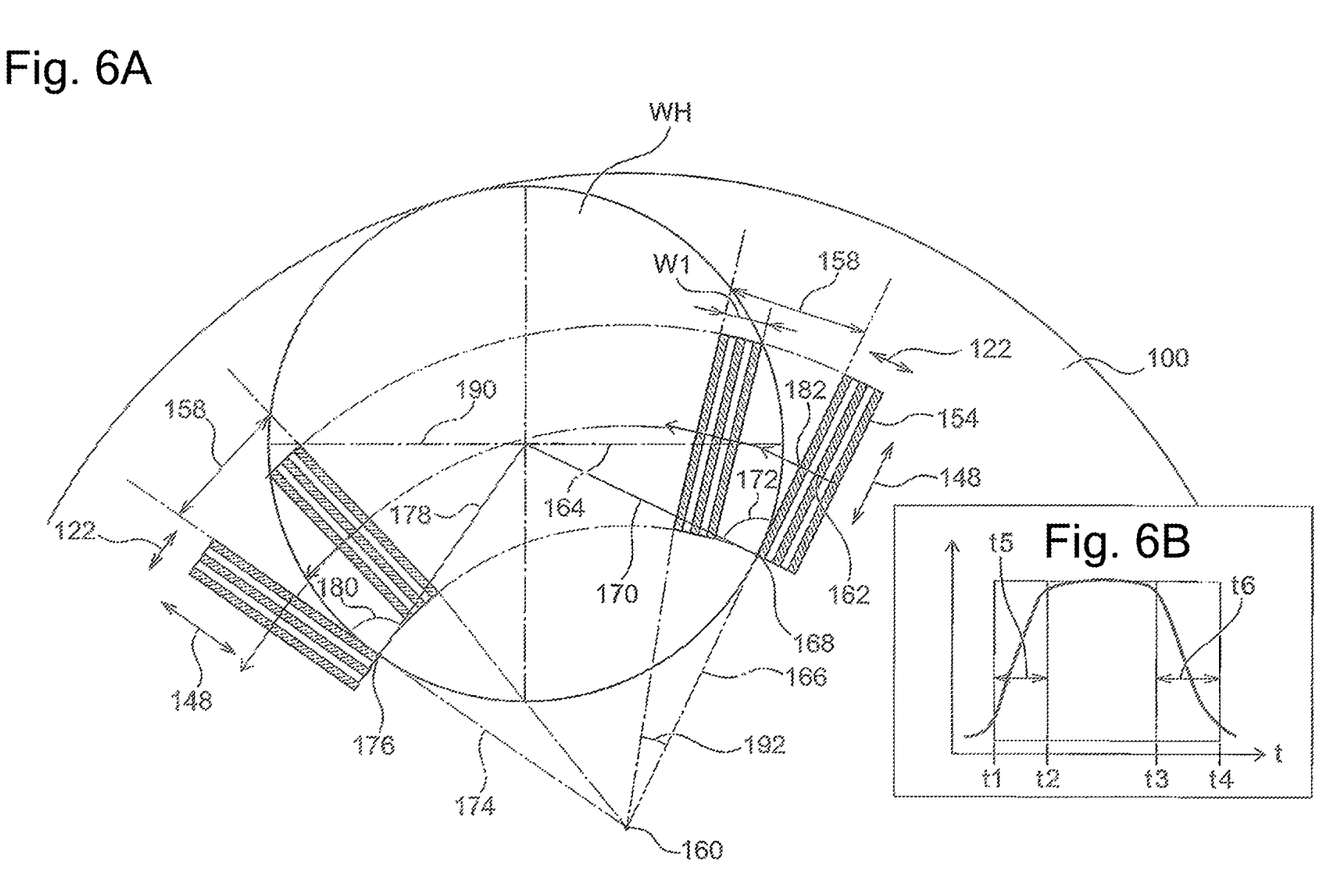
FIG. 6A shows a positional relationship between the core and the semiconductor wafer when the conventional sensor enters and exits from an edge region of the semiconductor wafer.
FIG. 6B shows a distance when a sensor output in the edge region rises and a distance when the sensor output in the edge region falls.

Regarding the arrangement of the sensor as shown in FIG. 6A, a distance when the sensor output rises and a distance when the sensor output falls in the edge region 158 are shown in FIG. 6B. In FIG. 6B, a horizontal axis represents the moving distance (mm) of the sensor, and a vertical axis represents the output of the sensor. At time t1, the sensor starts to detect the metal film of the semiconductor wafer WH, and at time t2, the sensor output becomes maximum. The difference t5 between the time t2 and the time t1 is the transit time in the edge region 158 at the time of incidence. The sensor output is maximum at time t3, and immediately after the time t3, a part of the sensor starts to exit from the semiconductor wafer WH. At time t4, the sensor output no longer detects the metal film on the semiconductor wafer WH. The difference t6 between the time t4 and the time t3 is the transit time in the edge region 158 at the time of exit. When the core 154 is installed as shown in FIG. 6A, the difference t5 and the difference t6 are equal to each other as shown in FIG. 6B.

It will be described with reference to FIG. 7 that the problem with the conventional core 154, that is, the problem that the rise of the sensor output at the wafer edge is slow can be overcome by the eddy current sensor 50 of the present embodiment. FIG. 7 shows the positional relationship between the core 136 and the semiconductor wafer WH when the eddy current sensor 50 of the present embodiment (only the core 136 is shown for clarity of description) enters the edge region 158 of the semiconductor wafer WH and when the eddy current sensor 50 exits from the edge region 158. Since the core 136 is arranged in the polishing table 100, the core 136 rotates around the rotation center 160 of the polishing table 100.

The arrangement direction of the core 136 in the polishing table 100 is set so that the direction in which the magnetic field of the core 136 intensifies (that is, the direction in which the magnetic flux spreads little) and the rotation direction of the core 136 coincide with each other. The reason why the core 136 is arranged so that the direction in which the magnetic field of the core 136 intensifies and the rotation direction of the core 136 coincide with each other resides in that the rise of the sensor output in the edge region 158 of the wafer WH is made quick.

In the case of the core 136, the direction in which the magnetic field of the core 136 intensifies is the first direction 122 shown in FIG. 4B as described above. Therefore, in FIG. 7, the first direction 122 and the rotation direction 162 of the core 154 substantially coincide with each other. In this case, as shown in FIG. 7, when the core 136 enters and exits from the edge regions 158, the shape of the sensor in the radial directions 170 and 178 (the first direction 122) of the semiconductor wafer WH is long in the edge region 158 of the wafer WH, and the shape of the sensor in the direction (the second direction 148) orthogonal to the radial direction 164 is short in the edge region 158 of the wafer WH.

When FIG. 6 and FIG. 7 are compared with each other, in the present embodiment of FIG. 7, the shape of the sensor is shortened in the direction (second direction 148) orthogonal to the radial direction 164. When FIG. 6 and FIG. 7 are compared with each other, the shape of the sensor is substantially identical in the first direction 122 between FIG. 6 and FIG. 7.

Further, as described above, it is necessary to install the core 136 in the polishing table 100 so that the incident angle 172 and the exit angle 180 of the core 136 to and from the wafer WH are equal to each other. The definitions of the incident angle 172 and the exit angle 180 are the same as in the case of FIG. 6. As is apparent from the comparison between FIGS. 6 and 7, when the shape of the sensor is shorter in the direction (second direction 148) orthogonal to the radial direction 164, the distance which is required for the sensor to have completely entered the inside of the wafer WH and the distance which is required for the sensor to have completely exited from the wafer WH, that is, the length of the edge region 158 is shorter.

In order to compare the sizes of the edge regions 158 in FIGS. 6 and 7, an angle 192 of the edge region 158 around the rotation center 160 in FIG. 6 and an angle 194 of the edge region 158 around the rotation center 160 in FIG. 7 are compared with each other. The magnitude of the angle 192 is about twice the magnitude of the angle 194. According to the present embodiment, the edge region 158 is reduced to about half of the conventional one. The rising time of the sensor output in the edge region 158 is shortened to about half in this embodiment.

Figures 7A, 7B:
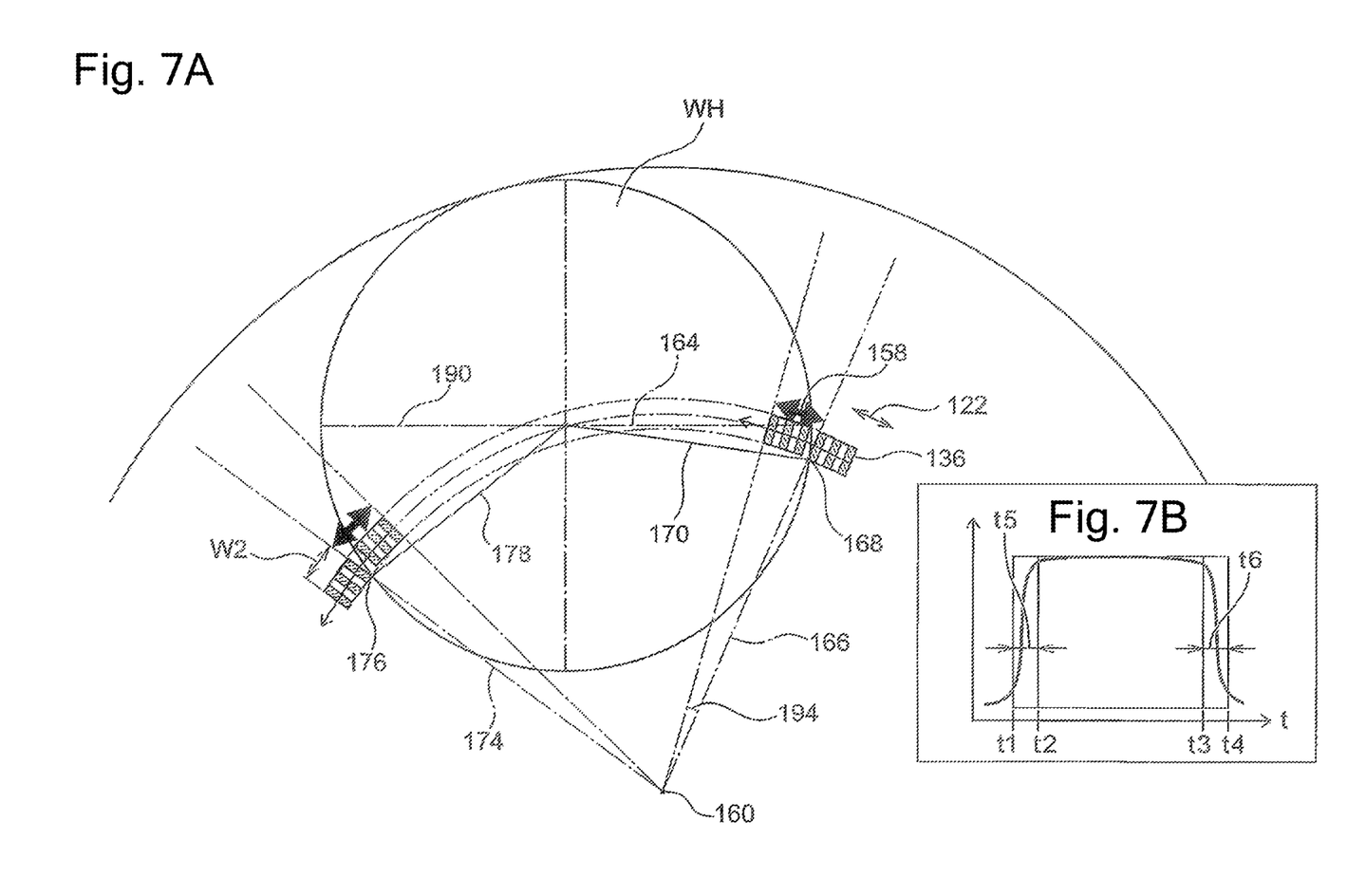
FIG. 7A shows a positional relationship between the core and the semiconductor wafer when the sensor according to the embodiment of the present invention enters and exits from the edge region of the semiconductor wafer.
FIG. 7B shows a distance when the sensor output in the edge region rises and a distance when the sensor output in the edge region falls.

With respect to the arrangement of the sensor as shown in FIG. 7A, the distance when the sensor output in the edge region 158 rises and the distance when the sensor output in the edge region 158 falls are shown in FIG. 7B. In FIG. 7B, a horizontal axis represents the moving distance (mm) of the sensor, and a vertical axis represents the output of the sensor. At time t1, the sensor starts to detect the metal film of the semiconductor wafer WH, and at time t2, the sensor output becomes maximum. The difference t5 between the time t2 and the time t1 is a transit time in the edge region 158 at the time of incidence. At time t3, the sensor output is maximum, and just after the time t3, a part of the sensor starts to exit from the semiconductor wafer WH. At time t4, the sensor output no longer detects the metal film of the semiconductor wafer WH. The difference t6 between the time t4 and the time t3 is a transit time in the edge region 158 at the time of exit. When the core 154 is installed as shown in FIG. 7A, the difference t5 and the difference t6 are equal to each other as shown in FIG. 7B. Comparing the difference t5 in FIG. 6B with the difference t5 in FIG. 7B, the difference t5 in FIG. 6B is about twice as long as the difference t5 in FIG. 7B.

It may be necessary to correct the sensor output in the edge region 158 of the wafer WH. The sensor 50 of the present embodiment which is short in the second direction 148 makes it possible to narrow a range in which the sensor output is required to be corrected. In the edge region 158 of the wafer WH, a range in which accurate measurement can be performed without correction is closer to the edge than that in the prior an. Therefore, the detection accuracy in the edge region 158 can be improved as compared with the prior art. Note that the fact that the sensor has substantially completely entered the inside of the wafer WH does not mean that the outer diameter of the sensor has substantially completely entered the inside of the wafer WH, but means that the magnetic field generated by the sensor has substantially completely entered the inside of the wafer.

The reason why the conventional sensor is configured to be longer in the second direction 148 is to enhance the measurement accuracy of the film thickness of the conductive film (for example, plating film) of the wafer by the eddy current sensor. In order to enhance the measurement accuracy, it is effective to increase the outer diameter of the eddy current sensor, that is, increase the outer diameter area to generate a large amount of eddy current in the conductive film, thereby increasing the detection output of the eddy current by the detection coil. Therefore, the core 154 is configured to be longer in the second direction 148 in the conventional sensor to increase the outer diameter area. The eddy current sensor 50 of the present embodiment has an outer diameter area smaller than that of the conventional sensor. However, the detection output of the eddy current by the detection coil can be increased by amplifying the output of the eddy current sensor 50.

Figure 8A:
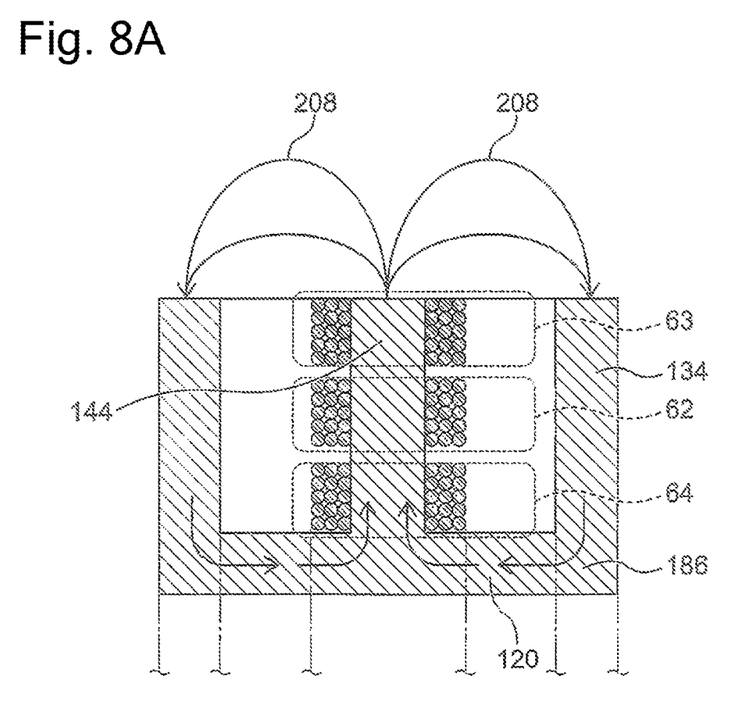
FIGS. 8A and 8B show a modification of FIGS. 5A and 5B.
Figure 8B:
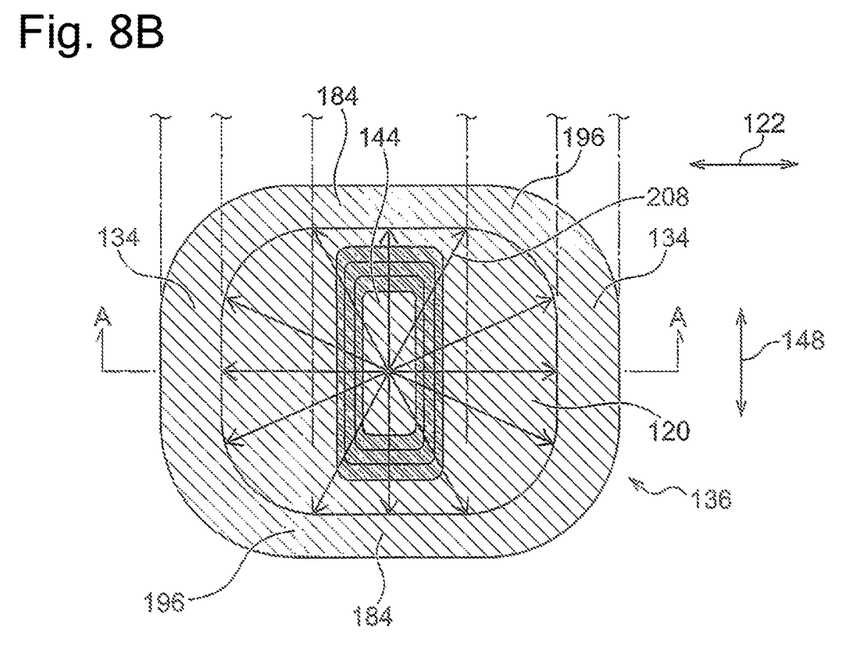

FIGS. 8A and 8B show a modification of the core shown in FIGS. 5A and 5B. FIGS. 8A and 8B are diagrams showing a detailed shape of the eddy current sensor 50 of the present embodiment. FIG. 8A is a cross-sectional view taken along a line A-A of the eddy current sensor 50 shown in FIG. 8B, and FIG. 8B is a plan view of the eddy current sensor 50.

The core 136 shown in FIG. 8 has side legs 184 which are respectively provided to the base portion 120 at both end portions 196 in the second direction 148 of the base portion 120. The side legs 184 are connected to the outer legs 134. The middle leg 144 is surrounded by the side legs 184 and the outer legs 134. In the embodiment of FIGS. 5A and 5B, in order to enhance the rise of the sensor output in the edge region 158, a wall of a ferrite core (that is, the side leg 184) is provided in an intrusion direction to the wafer WH (that is, the first direction 122) to suppress spread of the magnetic field. An open space is formed in the other directions to form the magnetic field broadly.

On the other hand, in the embodiment of FIGS. 8A and 8B, the magnetic field density is enhanced in all directions by surrounding the entire circumference of the middle leg 144 with the ferrite core (that is, the side legs 184 and the outer legs 134). In other words, the magnetic flux 208 directing from the middle leg 144 in the first direction 122 is converged into the outer legs 134. The magnetic flux 208 directing from the middle leg 144 in the second direction 148 is converged into the side legs 184. The E-type sensor having no wall of the magnetic material shown in FIGS. 5A and 5B has higher detection sensitivity than a rounded quadrangular type (pod type) shown in FIGS. 8A and 8B. This is because the magnetic field of the E-type sensor more greatly spreads in a direction in which the wall of the magnetic field is not provided as compared with the pod type, but the detection coil 63 of the E-type sensor can detect a larger amount of magnetic field.

Figure 9:
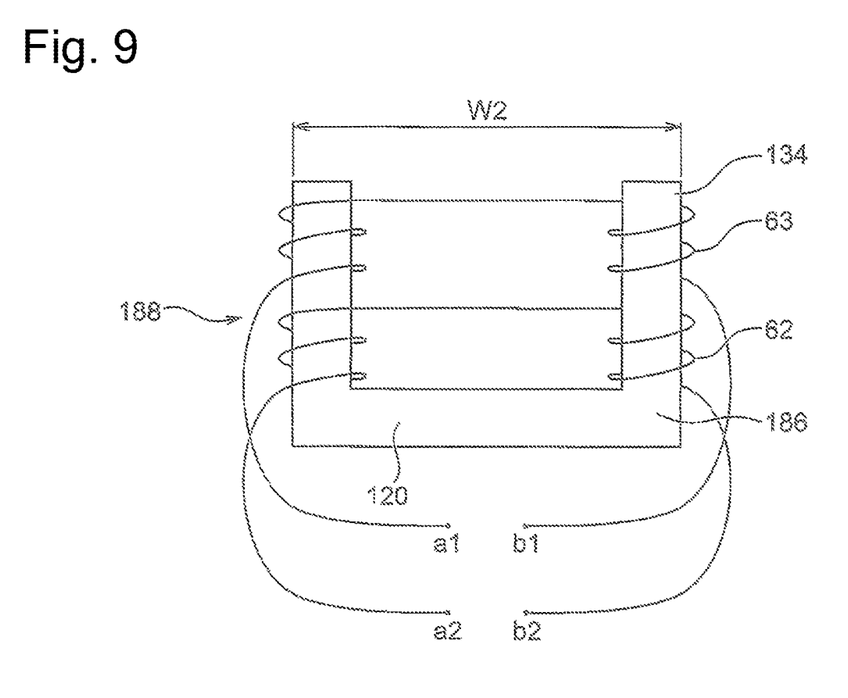
FIG. 9 is a diagram showing a shape of an eddy current sensor according to another embodiment of the present invention.

An eddy current sensor according to another embodiment of the present invention will be described with reference to FIG. 9. FIG. 9 is a diagram showing the shape of an eddy current sensor according to the other embodiment of the present invention. A core 188 is a U-shaped core, an excitation coil 62 is arranged on outer legs 134, and a detection coil 63 is also arranged on the outer legs 134.

The core 136 may include a ferrite material such as MnZn ferrite, NiZn ferrite or other ferrites. Conductive wires used for the detection coil 63, the excitation coil 62, and the dummy coil 64 are copper, manganin wires, nichrome wires, or the like. By using the manganin wires or the nichrome wires, temperature changes of electric resistors, etc. are little, and temperature characteristics are improved. The eddy current sensor 50 may be entirely coated with a material such as resin.

A method of controlling each component of the polishing apparatus based on the film thickness obtained by the sensor 50 will be described below. As shown in FIG. 1, the eddy current sensor 50 is connected to an end point detection controller 246, and the end point detection controller 246 is connected to a device controller 248. An output signal of the eddy current sensor 50 is sent to the end point detection controller 246. The end point detection controller 246 performs necessary processing (calculation processing/correction) on the output signal of the eddy current sensor 50 to generate a monitoring signal (film thickness data corrected by the end point detection controller 246). The device controller 248 controls the top ring motor 114, a motor (not shown) for the polishing table 100, and the like based on the corrected film thickness data.

The examples of the embodiments of the present invention have been described above. However, the above-described embodiments of the present invention are intended to facilitate understanding of the present invention and do not limit the present invention. The present invention can be modified and improved without departing from the subject matter thereof, and it goes without saying that the present invention includes equivalents thereof. Further, in a range in which at least some of the problems described above can be solved, or in a range in which at least some of the effects can be achieved, any combination or omission of the constituent elements described in the claims and the specification is possible.

This application claims priority under the Paris Convention to Japanese Patent Application No. 2019-124522 filed on Jul. 3, 2019. The entire disclosure of Japanese Patent Laid-Open No. 2019-124522 including specification, claims, drawings and summary is incorporated herein by reference in its entirety.

REFERENCE SIGNS LIST 50 eddy current sensor
62 excitation coil
63 detection coil
64 dummy coil
100 polishing table
101 polishing pad
120 base portion
122 first direction
136 core
144 middle leg
148 second direction
150 base portion
152 outer leg
156 middle leg
184 side leg
186 both end portions
246 end point detection controller
248 device controller

What is claimed is:

1. An eddy current sensor for measuring a film thickness of a conductive film formed on a substrate, comprising:
   a core made of a magnetic material including a base portion, and outer legs that are provided to the base portion at both end portions in a first direction of the base portion, respectively;
   an excitation coil that is arranged on the core and forms an eddy current in the conductive film; and
   a detection coil that is arranged on the core and detects the eddy current formed in the conductive film, wherein a length of the base portion in the first direction is longer than a length of the base portion in a second direction that is substantially orthogonal to the first direction,
   the outer legs extend from both end portions in a third direction away from both end portions,
   the third direction is substantially orthogonal to the first direction,
   the second direction is substantially orthogonal to the third direction, and
   an outer shape of the base portion is substantially rectangular when viewed from the third direction,
   wherein the eddy current sensor is configured to move along the first direction on the conductive film formed on the substrate.

2. The eddy current sensor according to claim 1, wherein the core is an E-shaped core having a middle leg that is provided to the base portion at a center in the first direction of the base portion, the excitation coil is arranged on the middle leg, and the detection coil is arranged on the middle leg.

3. The eddy current sensor according to claim 2, wherein the core has side legs that are provided to the base portion at both end portions in the second direction of the base portion respectively, the side legs are connected to the outer legs, and the middle leg is surrounded by the side legs and the outer legs.

4. The eddy current sensor according to claim 1, wherein the core is a U-shaped core, the excitation coil is arranged on the outer legs, and the detection coil is arranged on the outer legs.

5. A polishing apparatus comprising:
a polishing table configured so that a polishing pad for polishing a substrate is attached to the polishing table;
a driver configured to rotationally drive the polishing table;
a holder configured to press the substrate against the polishing pad while holding the substrate;
an eddy current sensor that is arranged inside the polishing tablet,
wherein the eddy current sensor measures a film thickness of a conductive film formed on the substrate, and comprises:
a core made of a magnetic material including a base portion, and outer legs that are provided to the base portion at both end portions in a first direction of the base portion, respectively;
an excitation coil that is arranged on the core and forms an eddy current in the conductive film; and
a detection coil that is arranged on the core and detects the eddy current formed in the conductive film,
wherein a length of the base portion in the first direction is longer than a length of the base portion in a second direction that is substantially orthogonal to the first direction; and
an endpoint detection controller configured to calculate film thickness data for the substrate from the detected eddy current,
wherein the outer legs extend from both end portions in a third direction away from both end portions,
the third direction is substantially orthogonal to the first direction,
the second direction is substantially orthogonal to the third direction, and
an outer shape of the base portion is substantially rectangular when viewed from the third direction,
wherein the eddy current sensor is configured to move along the first direction on the conductive film formed on the substrate.

6. The polishing apparatus according to claim 5, wherein the core is an E-shaped core having a middle leg that is provided to the base portion at a center in the first direction of the base portion, the excitation coil is arranged on the middle leg, and the detection coil is arranged on the middle leg.

7. The polishing apparatus according to claim 6, wherein the core has side legs that are provided to the base portion at both end portions in the second direction of the base portion respectively, the side legs are connected to the outer legs, and the middle leg is surrounded by the side legs and the outer legs.

8. The polishing apparatus according to claim 5, wherein the core is a U-shaped core, the excitation coil is arranged on the outer legs, and the detection coil is arranged on the outer legs.

* * * * *